US012685178B2

(12) United States Patent
Bai et al.

(10) Patent No.: US 12,685,178 B2
(45) Date of Patent: Jul. 14, 2026

(54) SEMICONDUCTOR STRUCTURE COMPRISING SUB-ALIGNMENT MARKS

(71) Applicants: Semiconductor Manufacturing International (Beijing) Corporation, Beijing (CN); Semiconductor Manufacturing International (Shanghai) Corporation, Shanghai (CN)

(72) Inventors: Xinxing Bai, Shanghai (CN); Yaping Wang, Shanghai (CN); Chunchao Fei, Shanghai (CN)

(73) Assignees: Semiconductor Manufacturing International (Beijing) Corporation, Beijing (CN); Semiconductor Manufacturing International (Shanghai) Corporation, Shanghai (CN)

( * ) Notice: Subject to any disclaimer, the term of this patent is extended or adjusted under 35 U.S.C. 154(b) by 583 days.

(21) Appl. No.: 17/974,240

(22) Filed: Oct. 26, 2022

(65) Prior Publication Data

US 2023/0139773 A1 May 4, 2023

(30) Foreign Application Priority Data

Oct. 28, 2021 (CN) .......................... 202111264284.1

(51) Int. Cl.
*H10W 46/00* (2026.01)
*H10D 84/03* (2025.01)
(Continued)

(52) U.S. Cl.
CPC .......... *H10W 46/00* (2026.01); *H10D 84/038* (2025.01); *H10P 74/273* (2026.01);
(Continued)

(58) Field of Classification Search
CPC ..... H01L 23/544; H01L 21/561; H01L 22/32; H01L 23/10; H01L 23/3171;
(Continued)

(56) References Cited

U.S. PATENT DOCUMENTS 6,300,223 B1 * 10/2001 Chang ..................... H01L 21/78
438/114
6,660,612 B1 * 12/2003 Chang .................... H10B 53/00
257/E23.179
(Continued)

FOREIGN PATENT DOCUMENTS

| CN | 106610564 A | 5/2017 |
| CN | 113534601 A | 10/2021 |
| TW | I222680 B | 10/2004 |

*Primary Examiner* — Duy T Nguyen
(74) *Attorney, Agent, or Firm* — Anova Law Group, PLLC

(57) ABSTRACT

A semiconductor structure and a fabrication method of the semiconductor structure are provided. The semiconductor structure includes a substrate, and the substrate includes a scribe line region. The semiconductor structure also includes a device layer over the substrate. The device layer includes multiple devices, an interconnection structure electrically connected to the devices, and a dielectric layer surrounding the devices and the interconnection structure. Further, the device layer includes a passivation layer over the device layer, and an alignment mark in the passivation layer over the scribe line region. The alignment mark includes two or more sub-alignment marks, the two or more sub-alignment marks are arranged along an extension direction of the scribe line region, and adjacent sub-alignment marks of the two or more sub-alignment marks are spaced apart from each other.

17 Claims, 3 Drawing Sheets

(51) Int. Cl.
　　*H10P 74/00*　　(2026.01)
　　*H10W 74/01*　　(2026.01)
　　*H10W 74/10*　　(2026.01)
　　*H10W 76/60*　　(2026.01)

(52) U.S. Cl.
　　CPC ....... *H10W 74/014* (2026.01); *H10W 74/137*
　　　　(2026.01); *H10W 76/60* (2026.01); *H10W*
　　　　*46/301* (2026.01); *H10W 46/501* (2026.01)

(58) Field of Classification Search
　　CPC . H01L 2223/54426; H01L 2223/54453; H01L
　　　　23/3192; H01L 22/34; H01L 23/562;
　　　　H01L 21/68; H10D 84/038
　　USPC .......................................................... 257/797
　　See application file for complete search history.

(56) References Cited

U.S. PATENT DOCUMENTS

| | | | |
|---|---|---|---|
| 2008/0296570 A1* | 12/2008 | Chen ........................ | H01L 22/34 |
| | | | 257/E23.01 |
| 2009/0075457 A1* | 3/2009 | Machida ............... | H10W 46/00 |
| | | | 257/E21.238 |
| 2014/0349439 A1* | 11/2014 | Kondo .................. | H10F 39/026 |
| | | | 438/70 |
| 2015/0348904 A1* | 12/2015 | Huang .................. | H10W 46/00 |
| | | | 438/666 |
| 2019/0333862 A1* | 10/2019 | Wang ..................... | H01L 24/19 |
| 2020/0312715 A1* | 10/2020 | Choi ................. | H01L 21/76838 |

* cited by examiner

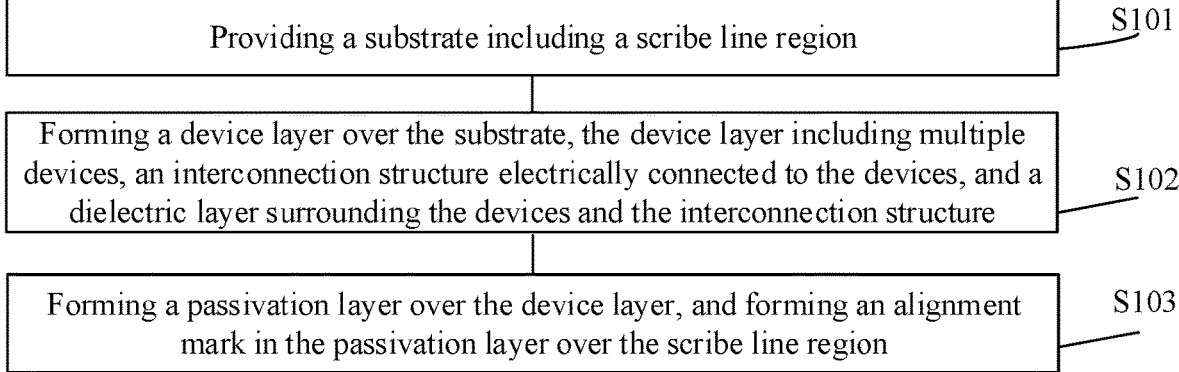

| Providing a substrate including a scribe line region | S101 |

| Forming a device layer over the substrate, the device layer including multiple devices, an interconnection structure electrically connected to the devices, and a dielectric layer surrounding the devices and the interconnection structure | S102 |

| Forming a passivation layer over the device layer, and forming an alignment mark in the passivation layer over the scribe line region | S103 |

Figure 6

SEMICONDUCTOR STRUCTURE COMPRISING SUB-ALIGNMENT MARKS

CROSS-REFERENCES TO RELATED APPLICATIONS

This application claims the priority of Chinese patent application No. 202111264284.1, filed on Oct. 28, 2021, the entirety of which is incorporated herein by reference.

FIELD OF THE DISCLOSURE

The present disclosure generally relates to the field of semiconductor manufacturing technology and, more particularly, relates to a semiconductor structure and a fabrication method thereof.

BACKGROUND

For semiconductor integrated circuits, various circuit element structures can be fabricated on a silicon wafer to form integrated circuit (IC) devices with specific electrical functions. The wafer then needs to be diced into a plurality of chips. The dicing process is performed on the scribe line region.

With the development of integrated circuits, to maximize the production capacity of various machines, to form circuit element structures with substantially high integration degree and complexity degree, and to perform wafer-level testing on the circuit element structures, alignment marks required for various machines and corresponding pads with various functions, etc., are designed in the scribe line region. Therefore, the metal patterns in the scribe line region are varied and in high density.

Meanwhile, to protect various circuit element structures on the silicon wafer, a seal ring is formed on the boundary of the scribe line region, and a passivation layer is formed on the scribe line region.

Often, a long and thick metal alignment mark needs to be formed in the front-end-of-line (FEOL), while the metal alignment mark has uneven stress distribution and too large local stress. Therefore, during the dicing process, when dicing the metal alignment mark, a peeling phenomenon of materials tends to occur in the region where the metal alignment mark is located. For example, the metal alignment mark has a long metal brushed problem (long burr), and the passivation layer also tends to have a peeling phenomenon. Because the long brushed metal tends to be in contact with surrounding seal ring and the circuit on the silicon wafer, the risk of electrical failure such as short circuit is easy to occur in the circuit, the circuit tends to have a risk of electrical failure such as short circuit, which leads to poor reliability of the semiconductor structure. The disclosed methods and device structures are directed to solve one or more problems set forth above and other problems.

BRIEF SUMMARY OF THE DISCLOSURE

One aspect of the present disclosure includes a semiconductor structure. The semiconductor structure includes a substrate, and the substrate includes a scribe line region. The semiconductor structure also includes a device layer over the substrate. The device layer includes multiple devices, an interconnection structure electrically connected to the devices, and a dielectric layer surrounding the devices and the interconnection structure. Further, the device layer includes a passivation layer over the device layer, and an alignment mark in the passivation layer over the scribe line region. The alignment mark includes two or more sub-alignment marks, the two or more sub-alignment marks are arranged along an extension direction of the scribe line region, and adjacent sub-alignment marks of the two or more sub-alignment marks are spaced apart from each other.

Optionally, a sub-alignment mark of the two or more sub-alignment marks includes a metal strip.

Optionally, a projection of the sub-alignment mark on a surface of the substrate has a rectangle shape. A length direction of the rectangle is parallel to the extension direction of the scribe line region, and a length-to-width ratio of the rectangle is in a range approximately between 1 and 2.4.

Optionally, a length of the sub-alignment mark in the extension direction of the scribe line region is in a range approximately between 70 µm and 120 µm, and a minimum distance between the adjacent sub-alignment marks in the extension direction of the scribe line region is approximately 50 µm.

Optionally, a width direction of the rectangle is perpendicular to the extension direction of the scribe line region, and a width of the sub-alignment mark is in a range approximately between 50 µm and 70 µm.

Optionally, the substrate further includes a plurality of first regions adjacent to the scribe line region, and the scribe line region is located between adjacent first regions of the plurality of first regions.

Optionally, the semiconductor structure further includes a seal ring over a border between the scribe line region and the adjacent first regions.

Optionally, in a direction perpendicular to a sidewall surface of the seal ring, a distance between the sub-alignment mark and the seal ring is greater than 5 µm.

Optionally, in a direction perpendicular to a surface of the substrate, a thickness of the sub-alignment mark is in a range approximately between 3.3 µm and 4 µm.

Optionally, the semiconductor structure further includes test keys and metal pads in the passivation layer over the scribe line region.

Another aspect of the present disclosure includes a fabrication method of a semiconductor structure. The method includes providing a substrate, where the substrate includes a scribe line region. The method also includes forming a device layer over the substrate. The device layer includes multiple devices, an interconnection structure electrically connected to the devices, and a dielectric layer surrounding the devices and the interconnection structure. Further, the method includes forming a passivation layer over the device layer, and forming an alignment mark in the passivation layer over the scribe line region. The alignment mark includes two or more sub-alignment marks, the two or more sub-alignment marks are arranged along an extension direction of the scribe line region, and adjacent sub-alignment marks of the two or more sub-alignment marks are spaced apart from each other.

Optionally, forming the passivation layer and the alignment mark includes: forming a lower passivation layer over the device layer; etching the lower passivation layer over the scribe line region, to from two or more grooves in the lower passivation layer over the scribe line region; forming the two or more sub-alignment marks in the two or more grooves; and forming an upper passivation layer on the lower passivation layer and on surfaces of the two or more sub-alignment marks, where the upper passivation layer and the lower passivation layer form the passivation layer.

Optionally, the alignment mark is configured to form a metal interconnection layer in back-end-of-line.

Optionally, the substrate further includes a plurality of first regions adjacent to the scribe line region, and the scribe line region is located between adjacent first regions of the plurality of first regions.

Optionally, the method further includes performing a dicing process on the scribe line region to form a plurality of mutually independent chips, where each chip includes a first region of the plurality of first regions.

Optionally, a sub-alignment mark of the two or more sub-alignment marks includes a metal strip.

Optionally, a projection of the sub-alignment mark on a surface of the substrate has a rectangle shape. A length direction of the rectangle is parallel to the extension direction of the scribe line region, a width direction of the rectangle is perpendicular to the extension direction of the scribe line region, and a length-to-width ratio of the rectangle is in a range approximately between 1 and 2.4.

Optionally, a length of the sub-alignment mark is in a range approximately between 70 μm and 120 μm. A width of the sub-alignment mark is in a range approximately between 50 μm and 70 μm. A minimum distance between the adjacent sub-alignment marks in the extension direction of the scribe line region is approximately 50 μm.

Optionally, in a direction perpendicular to a surface of the substrate, a thickness of the sub-alignment mark is in a range approximately between 3.3 μm and 4 μm.

Optionally, the method further includes forming test keys and metal pads in the passivation layer over the scribe line region.

The disclosed embodiments may have following beneficial effects. In the disclosed semiconductor structure, the alignment mark in the passivation layer over the scribe line region may include two or more sub-alignment marks, and the two or more sub-alignment marks may be arranged along the extension direction of the scribe line region. In addition, the adjacent sub-alignment marks may be spaced apart from each other. Therefore, the substantially long alignment mark composed of the two or more sub-alignment marks may still satisfy the requirements for long alignment mark in the back-end-of-line (BEOL). In view of this, the short and spaced sub-alignment marks may still have desired uniform stress distribution and small local stress. When subsequently dicing the scribe line region, the peeling phenomenon may be less likely to occur, thereby reducing the risk that the long brushed conductive material is in contact with the devices and interconnection structure over the first region, and improving the reliability of the semiconductor structure.

Other aspects of the present disclosure can be understood by those skilled in the art in light of the description, the claims, and the drawings of the present disclosure.

BRIEF DESCRIPTION OF THE DRAWINGS

FIG. 6 illustrates a flowchart of an exemplary method for forming a semiconductor structure consistent with various disclosed embodiments of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or the alike parts.

The present disclosure provides a semiconductor structure and a fabrication method of a semiconductor structure. In the disclosed semiconductor structure, an alignment mark in a passivation layer over a scribe line region may include two or more sub-alignment marks, and the two or more sub-alignment marks may be arranged along an extension direction of the scribe line region. Further, adjacent sub-alignment marks may be spaced apart from each other. Therefore, the semiconductor structure may have desired reliability.

FIG. 6 illustrates a flowchart of a method for forming a semiconductor structure consistent with various disclosed embodiments of the present disclosure, and FIGS. 1-5 illustrate semiconductor structures corresponding to certain stages of the fabrication method.

Figure 1:
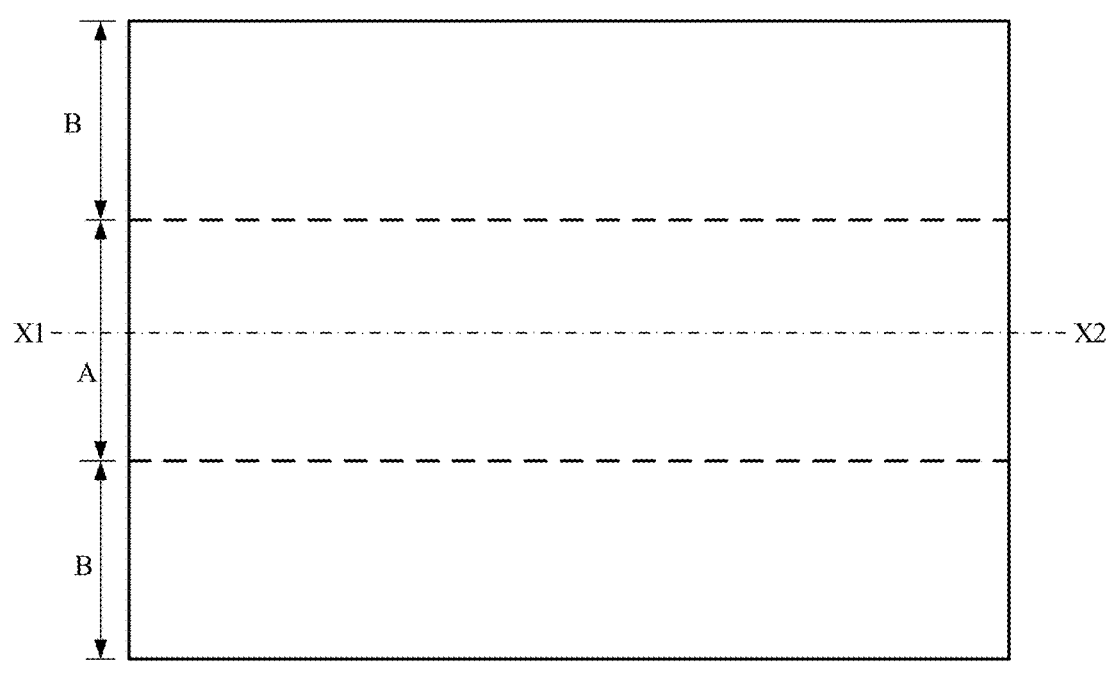
FIGS. 1-5 illustrate semiconductor structures corresponding to certain stages for forming an exemplary semiconductor structure consistent with various disclosed embodiments of the present disclosure.
Figure 2:
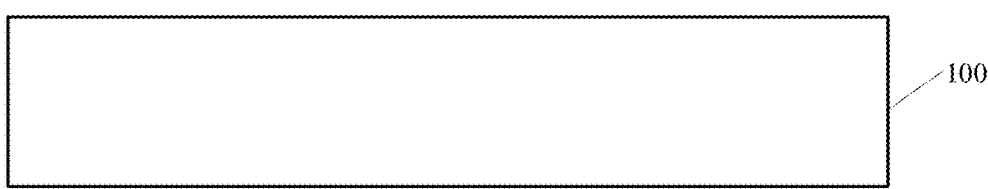

As shown in FIG. 6, at the beginning of the fabrication method, a substrate including a scribe line region may be provided (S101). FIGS. 1-2 illustrate a corresponding semiconductor structure.

FIG. 1 illustrates a schematic top view of the structure shown in FIG. 2, and FIG. 2 illustrates a schematic X1-X2 cross-sectional view of the structure shown in FIG. 1. Referring to FIG. 1 and FIG. 2, a substrate 100 may be provided.

In one embodiment, the substrate 100 may be made of a semiconductor material. In one embodiment, the substrate 100 may be made of a material including silicon. In certain embodiments, the substrate may be made of a material including silicon carbide, silicon germanium, a multi-component semiconductor material composed of Group III-V elements, silicon-on-insulator (SOI), or germanium-on-insulator (GOI), etc. The multi-component semiconductor material composed of Group III-V elements may include InP, GaAs, GaP, InAs, InSb, InGaAs, or InGaAsP, etc.

The substrate 100 may include a scribe line region A. The substrate 100 may further include a plurality of first regions B adjacent to the scribe line region A. In one embodiment, the scribe line region A may be located between adjacent first regions B.

The scribe line region A may reserve space for the dicing process after forming the semiconductor wafer, to divide the semiconductor wafer into a plurality of chips. After performing the dicing process, each chip may include a device layer subsequently formed on the first region B.

For illustrative purposes, FIG. 1 merely illustrates a portion of the two first regions B, and the scribe line region A between the two first regions B, although more or less portions, and/or more or less regions may be included in FIG. 1.

Figure 3:
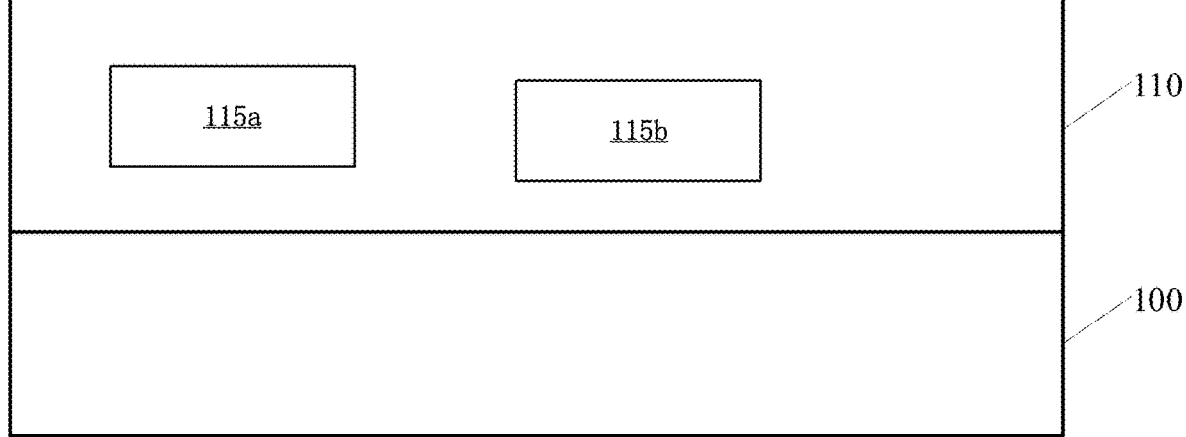

Returning to FIG. 6, after providing the substrate, a device layer including multiple devices, an interconnection structure electrically connected to the devices, and a dielectric layer surrounding the devices and the interconnection structure may be formed over the substrate (S102). FIG. 3 illustrates a corresponding semiconductor structure.

Referring to FIG. 3, a device layer 110 may be formed on the substrate 100. In one embodiment, the device layer 110 may include multiple devices, such as multiple semiconductor devices 115a/115b, an interconnection structure electrically connected to the devices (not shown in the Figure), and a dielectric layer surrounding the devices and the interconnection structure (not shown in the Figure).

In one embodiment, the multiple devices may include electronic devices such as transistors, resistors, and capacitors, etc. The multiple devices and the interconnection structure may form an integrated circuit.

The dielectric layer may be made of a material including a dielectric material. The dielectric material may include one or more of titanium oxide, zirconium oxide, hafnium oxide, silicon oxide, silicon nitride, silicon carbide, silicon oxy-carbide, silicon oxy-nitride, aluminum oxide, aluminum nitride, silicon nitride carbide, and silicon oxy-carbo-nitride.

Figure 4:
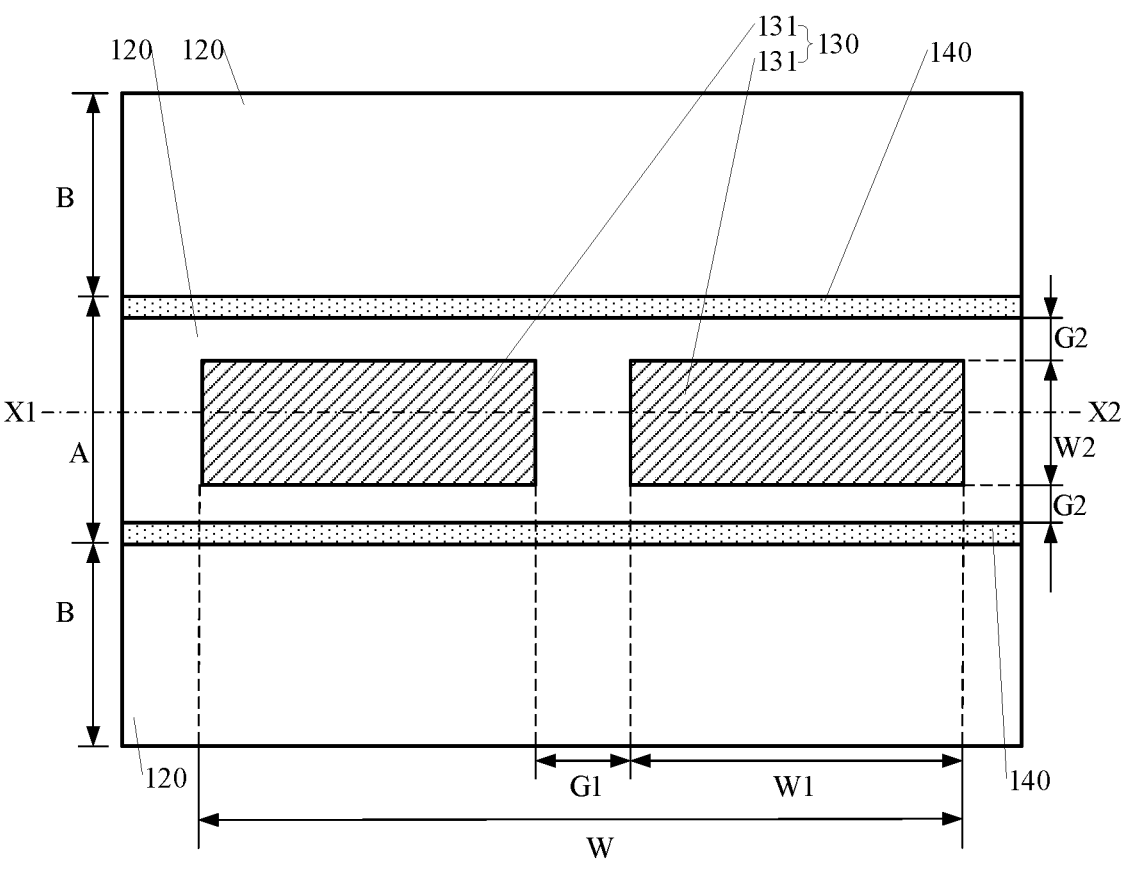
Figure 5:
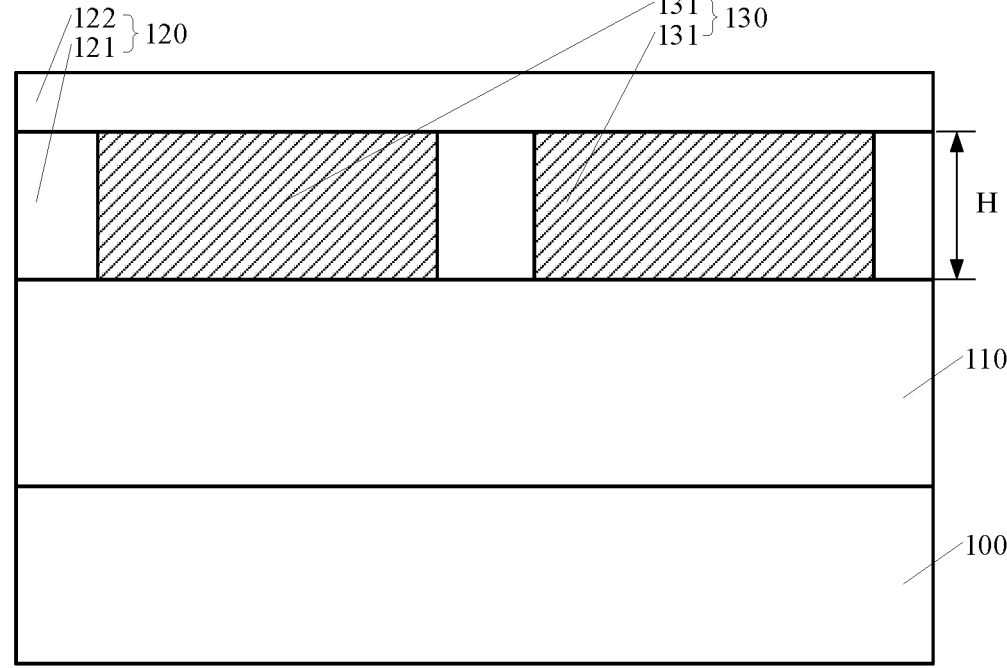

Returning to FIG. 6, after forming the device layer, a passivation layer over the device layer may be formed over the device layer, and an alignment mark may be formed in the passivation layer over the scribe line region (S103). FIGS. 4-5 illustrate a corresponding semiconductor structure.

FIG. 4 illustrates a schematic top view of the structure shown in FIG. 5, and FIG. 5 illustrates a schematic X1-X2 cross-sectional view of the structure shown in FIG. 4. Referring to FIG. 4 and FIG. 5, a passivation layer 120 may be formed on the device layer 110, and an alignment mark 130 may be formed in the passivation layer 120 over the scribe line region A. The alignment mark 130 may include two or more sub-alignment marks 131, and the two or more sub-alignment marks 131 may be arranged along an extension direction of the scribe line region A. Further, the adjacent sub-alignment marks 131 may be spaced apart from each other.

Projections of the two or more sub-alignment marks 131 of the alignment mark 130 on the surface of the substrate 100 may be located within a range of the scribe line region A. It should be understood that the extension direction of the scribe line region A may refer to an extension direction of the portion of the scribe line region A where the projections are located. In addition, the alignment mark 130 may be used for alignment with a last layer in the back-end-of-line (BEOL). Therefore, a thickness H of the sub-alignment mark 131 in a direction perpendicular to the surface of the substrate 100 may often be substantially thick.

The alignment mark 130 in the passivation layer 120 over the scribe line region A may include two or more sub-alignment marks 131, and the two or more sub-alignment marks 131 may be arranged along the extension direction of the scribe line region A. In addition, the adjacent sub-alignment marks 131 may be spaced apart from each other. Therefore, the substantially long alignment mark 130 composed of the two or more sub-alignment marks 131 may still satisfy the requirements for long alignment mark in the back-end-of-line (BEOL). In view of this, even if the thickness H is substantially thick, the short and spaced sub-alignment marks 131 may still have desired uniform stress distribution and small local stress. When subsequently dicing the scribe line region A, the peeling phenomenon may be less likely to occur, thereby reducing the risk that the long brushed conductive material is in contact with the devices and interconnection structure over the first region B, and improving the reliability of the semiconductor structure.

It should be noted that for illustrative purposes, FIG. 4 may merely schematically illustrate two sub-alignment marks 131 with the same projected shape. In practical applications, the two or more sub-alignment marks 131 may include two sub-alignment marks 131 or a plurality of sub-alignment marks 131. Further, the projected shape of each sub-alignment mark 131 on the surface of the substrate 100 may be the same or different.

In one embodiment, the quantity of sub-alignment marks 131 may be two, to better reduce the difficulty and complexity of the process. In one embodiment, the projected shape of each sub-alignment mark 131 may be the same, to better reduce the difficulty and complexity of the process.

In one embodiment, in the direction perpendicular to the surface of the substrate, the thickness H of the sub-alignment mark 131 may be in a range approximately between 3.3 μm and 4 μm.

In one embodiment, the alignment mark 130 may be configured to form a metal interconnection layer in the back-end-of-line.

In one embodiment, the sub-alignment mark 131 may include a metal strip. The sub-alignment mark 131 may be made of a material including a conductive material such as copper, aluminum, gold, and silver.

In one embodiment, the projection of the sub-alignment mark 131 on the surface of the substrate 100 may have a rectangle shape. A length direction of the rectangle may be parallel to the extension direction of the scribe line region A, and a width direction of the rectangle may be perpendicular to the extension direction of the scribe line region A. At the same time, a length-to-width ratio of the rectangle may be in a range approximately between 1 and 2.4, in other words, 1≤(W1/W2)≤2.4, where W1 (as shown in FIG. 4) may be the length of the rectangle, and W2 (as shown in FIG. 4) may be the width of the rectangle.

To form the alignment mark 130 with a substantially long total length W (as shown in FIG. 4) using two or more sub-alignment marks 131, if the length-to-width ratio of the sub-alignment mark is too small, a substantially large amount of sub-alignment marks 131 may need to be formed, which may lead to a substantially large process difficulty and complexity; if the length-to-width ratio of the sub-alignment mark is too large, when subsequently dicing the scribe line region A, the ability to improve the peeling phenomenon may be limited. Therefore, by choosing a suitable length-to-width ratio of the rectangle, in other words, the length-to-width ratio of the rectangle may be in a range approximately between 1 and 2.4, such that the peeling phenomenon may be effectively improved while reducing the process difficulty and complexity.

In one embodiment, the length (equivalent to the length W1) of the sub-alignment mark 131 in the extension direction of the scribe line region A may be in a range approximately between 70 μm and 120 μm. A minimum distance G1 (as shown in FIG. 4) between the adjacent sub-alignment marks 131 in the extension direction of the scribe line region A may be approximately 50 μm, to effectively reduce the risk of peeling phenomenon.

In one embodiment, the width of the sub-alignment mark 131 (equivalent to the width W2) may be in a range approximately between 50 μm and 70 μm, to effectively reduce the risk of peeling phenomenon.

In one embodiment, forming the passivation layer 120 and the alignment mark 130 may include: forming a lower passivation layer 121 on the device layer 110; etching the lower passivation layer 121 over the scribe line region A, to from two or more grooves (not shown in the Figure) in the lower passivation layer 121 over the scribe line region A; forming the two or more sub-alignment marks 131 in the two or more grooves; and forming an upper passivation layer 122 on the lower passivation layer 121 and the surfaces of the two or more sub-alignment marks 131. The upper passivation layer 122 and the lower passivation layer 121 may form the passivation layer 120.

In one embodiment, forming the lower passivation layer 121 may include a chemical vapor deposition process, a physical vapor deposition process, a fluid chemical vapor deposition process, or a spin coating process, etc. Forming the upper passivation layer 122 may include a chemical vapor deposition process, a physical vapor deposition process, a fluid chemical vapor deposition process, or a spin coating process, etc.

In one embodiment, etching the lower passivation layer 121 over the scribe line region A may include at least one of a dry etching process and a wet etching process.

In one embodiment, the passivation layer 120 may be made of a material including a dielectric material, and the dielectric material may include one or more of titanium oxide, zirconium oxide, hafnium oxide, silicon oxide, silicon nitride, silicon carbide, silicon oxy-carbide, silicon oxy-nitride, aluminum oxide, aluminum nitride, silicon nitride carbide, and silicon oxy-carbo-nitride.

In one embodiment, forming the sub-alignment mark 131 in the groove may include: forming a sub-alignment mark material layer (not shown in the Figure) in the groove and on the surface of the lower passivation layer 121; and planarizing the sub-alignment mark material layer until the surface of the lower passivation layer 121 is exposed, to form the sub-alignment mark 131.

In one embodiment, forming the sub-alignment mark material layer may include a chemical vapor deposition process, or a metal electroplating process, etc. Planarizing the sub-alignment mark material layer may include a chemical mechanical polishing process.

It should be noted that for illustrative purposes, the upper passivation layer 122 may not be shown in FIG. 4.

In one embodiment, in the process of forming the device layer 110, the passivation layer 120 and the alignment mark 130, a seal ring 140 may be formed in the device layer 110 and the passivation layer 120 over the border between scribe line region A and the first region B.

The seal ring 140 may be configured to protect the integrated circuits over the first region B, to better reduce the risk of damage to the integrated circuits over the first region B.

In one embodiment, in a direction perpendicular to a sidewall surface of the seal ring 140, a distance G2 (as shown in FIG. 4) between the sub-alignment mark 131 and the seal ring 140 may be greater than 5 μm. The substantially large distance G2 between the sub-alignment mark 131 and the seal ring 140 may reduce the risk that burrs formed after dicing the sub-alignment marks 131 contacts the seal ring 140, and may further reduce the risk of electrical failure such as short circuit occurred in the circuit, to further improve the reliability of the semiconductor structure.

In one embodiment, in the process of forming the passivation layer 120 and the alignment mark 130, test keys (not shown) and metal pads (not shown) may also be formed in the passivation layer 120 over the scribe line region A. The test keys and metal pads are at least used for wafer level testing.

In various embodiments, to inspect electrical characteristics of the semiconductor device, a test probe may be used to connect to the semiconductor device after the semiconductor device is formed. The test probe may include test pins, and the semiconductor device may include a test key. The test key may include metal pads corresponding to the test pins of the test probe. After the test probe is moved to contact with the test key, the test pins may be aligned with the metal pads formed on the semiconductor device to make electrical connections. To effectively inspect the electrical characteristics of the semiconductor device and avoid damaging the semiconductor, each test pin of the test probe may provide desirable electrical contact with a corresponding metal pad of the test key on the semiconductor device.

In one embodiment, after forming the passivation layer 120 and the alignment mark 130, a dicing process may be performed on the scribe line region A to form a plurality of mutually independent chips (not shown), and each chip may include the first region B.

Correspondingly, the present disclosure also provides a semiconductor structure. Referring to FIGS. 4-5, the semiconductor structure may include a substrate 100 including a scribe line region A; a device layer 110 on the substrate 100; a passivation layer 120 on the device layer 110; and an alignment mark 130 in the passivation layer 120 over the scribe line region A. The alignment mark 130 may include two or more sub-alignment marks 131, and the two or more sub-alignment marks 131 may be arranged along an extension direction of the scribe line region A. Further, adjacent sub-alignment marks 131 may be spaced apart from each other.

In one embodiment, the substrate 100 may further include a plurality of first regions B adjacent to the scribe line region A. In one embodiment, the scribe line region A may be located between adjacent first regions B.

The scribe line region A may reserve space for the dicing process after forming the semiconductor wafer, to divide the semiconductor wafer into a plurality of chips. After performing the dicing process, each chip may include the device layer 110 formed on the first region B.

The device layer 110 may include multiple devices (not shown in the Figure), an interconnection structure electrically connected to the devices (not shown in the Figure), and a dielectric layer surrounding the devices and the interconnection structure (not shown in the Figure).

In one embodiment, the multiple devices may include electronic devices such as transistors, resistors, and capacitors, etc. The multiple devices and the interconnection structure may form an integrated circuit.

Projections of the two or more sub-alignment marks 131 of the alignment mark 130 on the surface of the substrate 100 may be located within a range of the scribe line region A. It should be understood that the extension direction of the scribe line region A may refer to an extension direction of the portion of the scribe line region A where the projections are located. In addition, the alignment mark 130 may be used for alignment with a last layer in the back-end-of-line (BEOL). Therefore, a thickness H of the sub-alignment mark 131 in the direction perpendicular to the surface of the substrate 100 may often be substantially thick.

The alignment mark 130 in the passivation layer 120 over the scribe line region A may include two or more sub-alignment marks 131, and the two or more sub-alignment marks 131 may be arranged along the extension direction of the scribe line region A. In addition, the adjacent sub-alignment marks 131 may be spaced apart from each other. Therefore, the substantially long alignment mark 130 composed of the two or more sub-alignment marks 131 may still satisfy the requirements for long alignment mark in the back-end-of-line (BEOL). In view of this, even if the thickness H is substantially thick, the short and spaced sub-alignment marks 131 may still have desired uniform stress distribution and small local stress. When subsequently dicing the scribe line region A, the peeling phenomenon may be less likely to occur, thereby reducing the risk that the long brushed conductive material is in contact with the devices and interconnection structure over the first region B, and improving the reliability of the semiconductor structure.

It should be noted that the two or more sub-alignment marks 131 may include two sub-alignment marks 131 or a plurality of sub-alignment marks 131. Further, the projected shape of each sub-alignment mark 131 on the surface of the substrate 100 may be the same or different.

In one embodiment, the quantity of sub-alignment marks 131 may be two, to better reduce the difficulty and complexity of the process. In one embodiment, the projected shape of each sub-alignment mark 131 may be the same, to better reduce the difficulty and complexity of the process.

In one embodiment, in the direction perpendicular to the surface of the substrate, the thickness H of the sub-alignment mark 131 may be in a range approximately between 3.3 μm and 4 μm.

In one embodiment, the alignment mark 130 may be configured to form a metal interconnection layer in the back-end-of-line (BEOL).

In one embodiment, the sub-alignment mark 131 may include a metal strip. The sub-alignment mark 131 may be made of a material including a conductive material such as copper, aluminum, gold, and silver.

In one embodiment, the projection of the sub-alignment mark 131 on the surface of the substrate 100 may have a rectangle shape. A length direction of the rectangle may be parallel to the extension direction of the scribe line region A, and a width direction of the rectangle may be perpendicular to the extension direction of the scribe line region A. At the same time, a length-to-width ratio of the rectangle may be in a range approximately between 1 and 2.4, in other words, $1 \leq (W1/W2) \leq 2.4$, where W1 (as shown in FIG. 4) may be the length of the rectangle, and W2 (as shown in FIG. 4) may be the width of the rectangle.

To form the substantially long alignment mark 130 using two or more sub-alignment marks 131, if the length-to-width ratio of the sub-alignment mark 131 is too small, a substantially large amount of sub-alignment marks 131 may need to be formed, which may lead to a substantially large process difficulty and complexity; if the length-to-width ratio of the sub-alignment mark 131 is too large, when subsequently dicing the scribe line region A, the ability to improve the peeling phenomenon may be limited. Therefore, by choosing a suitable length-to-width ratio of the rectangle, in other words, the length-to-width ratio of the rectangle may be in a range approximately between 1 and 2.4, such that the peeling phenomenon may be effectively improved while reducing the process difficulty and complexity.

In one embodiment, the length (equivalent to the length W1) of the sub-alignment mark 131 in the extension direction of the scribe line region A may be in a range approximately between 70 μm and 120 μm. A minimum distance G1 (as shown in FIG. 4) between the adjacent sub-alignment marks 131 in the extension direction of the scribe line region A may be approximately 50 μm, to effectively reduce the risk of peeling phenomenon.

In one embodiment, the width of the sub-alignment mark 131 (equivalent to the width W2) may be in a range approximately between 50 μm and 70 μm, to effectively reduce the risk of peeling phenomenon.

In one embodiment, the passivation layer 120 may include a lower passivation layer 121, and an upper passivation layer 122 on the lower passivation layer 121 and the surfaces of the two or more sub-alignment marks 131.

In one embodiment, the passivation layer 120 may be made of a material including a dielectric material, and the dielectric material may include one or more of titanium oxide, zirconium oxide, hafnium oxide, silicon oxide, silicon nitride, silicon carbide, silicon oxy-carbide, silicon oxy-nitride, aluminum oxide, aluminum nitride, silicon nitride carbide, and silicon oxy-carbo-nitride.

The dielectric layer of the device layer 110 may be made of a material including a dielectric material. The dielectric material may include one or more of titanium oxide, zirconium oxide, hafnium oxide, silicon oxide, silicon nitride, silicon carbide, silicon oxy-carbide, silicon oxy-nitride, aluminum oxide, aluminum nitride, silicon nitride carbide, and silicon oxy-carbo-nitride.

In one embodiment, the semiconductor structure may also include a seal ring 140 over the border between the scribe line region A and the first region B. The seal ring 140 may be configured to protect the integrated circuits over the first region B, to better reduce the risk of damage to the integrated circuits over the first region B.

In one embodiment, in a direction perpendicular to a sidewall surface of the seal ring 140, a distance G2 (as shown in FIG. 4) between the sub-alignment mark 131 and the seal ring 140 may be greater than 5 μm. The substantially large distance G2 between the sub-alignment mark 131 and the seal ring 140 may reduce the risk that burrs formed after dicing the sub-alignment marks 131 contacts the seal ring 140, and may further reduce the risk of electrical failure such as short circuit occurred in the circuit, to further improve the reliability of the semiconductor structure.

In one embodiment, the semiconductor structure may further include test keys (not shown) and metal pads (not shown) in the passivation layer 120 over the scribe line region A.

In various embodiments, to inspect electrical characteristics of the semiconductor device, a test probe may be used to connect to the semiconductor device after the semiconductor device is formed. The test probe may include test pins, and the semiconductor device may include a test key. The test key may include metal pads corresponding to the test pins of the test probe. After the test probe is moved to contact with the test key, the test pins may be aligned with the metal pads formed on the semiconductor device to make electrical connections. To effectively inspect the electrical characteristics of the semiconductor device and avoid damaging the semiconductor, each test pin of the test probe may provide desirable electrical contact with a corresponding metal pad of the test key on the semiconductor device.

The disclosed embodiments may have following beneficial effects. In the disclosed semiconductor structure, the alignment mark in the passivation layer over the scribe line region may include two or more sub-alignment marks, and the two or more sub-alignment marks may be arranged along the extension direction of the scribe line region. In addition, the adjacent sub-alignment marks may be spaced apart from each other. Therefore, the substantially long alignment mark composed of the two or more sub-alignment marks may still satisfy the requirements for long alignment mark in the back-end-of-line (BEOL). In view of this, the short and spaced sub-alignment marks may still have desired uniform stress distribution and small local stress. When subsequently dicing the scribe line region, the peeling phenomenon may be less likely to occur, thereby reducing the risk that the long brushed conductive material is in contact with the devices and interconnection structure over the first region, and improving the reliability of the semiconductor structure.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A semiconductor structure, comprising:
a substrate, wherein the substrate comprises a scribe line region;
a device layer over the substrate, wherein the device layer comprises multiple semiconductor devices;
a passivation layer over the device layer; and
an alignment mark in the passivation layer over the scribe line region, wherein
the alignment mark comprises two or more sub-alignment marks,
the two or more sub-alignment marks are arranged on a plane coplanar with a bottom surface of the passivation layer and the scribe line region contains only one single set of the two or more sub-alignment marks that are aligned with each other along an extension direction thereof within the scribe line region,
a projection of each sub-alignment mark on a surface of the substrate has a rectangle shape, wherein a length direction of the rectangle is parallel to the extension direction of the scribe line region, and a length-to-width ratio of the rectangle is in a range between 1 and 2.4, such that process difficulty and complexity, and material peeling are reduced, and
adjacent sub-alignment marks of the two or more sub-alignment marks aligned along the extension direction of the scribe line region are spaced apart from each other having a gap there-between.

2. The semiconductor structure according to claim 1, wherein:
a sub-alignment mark of the two or more sub-alignment marks comprises a metal strip.

3. The semiconductor structure according to claim 1, wherein:
a minimum gap between the adjacent sub-alignment marks in the extension direction of the scribe line region is approximately 50 μm, to reduce the material peeling at dicing.

4. The semiconductor structure according to claim 1, wherein:
a length of the sub-alignment mark in the extension direction of the scribe line region is in a range approximately between 70 μm and 120 μm, and
a width direction of the rectangle is perpendicular to the extension direction of the scribe line region, and
a width of the sub-alignment mark is in a range approximately between 50 μm and 70 μm.

5. The semiconductor structure according to claim 1, wherein:
the substrate further comprises a plurality of first regions adjacent to the scribe line region, wherein the scribe line region is located between adjacent first regions of the plurality of first regions.

6. The semiconductor structure according to claim 5, further comprising:
a seal ring over a border between the scribe line region and the adjacent first regions.

7. The semiconductor structure according to claim 6, wherein:
in a direction perpendicular to a sidewall surface of the seal ring, a distance between each sub-alignment mark and the seal ring is greater than 5 μm.

8. The semiconductor structure according to claim 1, wherein:
in a direction perpendicular to a surface of the substrate, a thickness of each sub-alignment mark from the bottom surface of the passivation layer is in a range approximately between 3.3 μm and 4 μm, such that the two or more sub-alignment marks are configured short and spaced, providing uniform stress distribution and reduced local stress.

9. The semiconductor structure according to claim 1, wherein:
the alignment mark is configured for back-end-of-line.

10. A fabrication method of a semiconductor structure, comprising:
providing a substrate, wherein the substrate comprises a scribe line region;
forming a device layer over the substrate, wherein the device layer comprises multiple semiconductor devices;
forming a passivation layer over the device layer; and
forming an alignment mark in the passivation layer over the scribe line region, wherein
the alignment mark comprises two or more sub-alignment marks,
the two or more sub-alignment marks are arranged on a plane coplanar with a bottom surface of the passivation layer and the scribe line region contains only one single set of the two or more sub-alignment marks that are aligned with each other along an extension direction thereof within the scribe line region,
a projection of each sub-alignment mark on a surface of the substrate has a rectangle shape, wherein a length direction of the rectangle is parallel to the extension direction of the scribe line region, and a length-to-width ratio of the rectangle is in a range between 1 and 2.4, such that process difficulty and complexity, and material peeling are reduced, and
adjacent sub-alignment marks of the two or more sub-alignment marks aligned along the extension direction of the scribe line region are spaced apart from each other having a gap there-between.

11. The method according to claim 10, forming the passivation layer and the alignment mark comprises:
forming a lower passivation layer over the device layer;
etching the lower passivation layer over the scribe line region, to from two or more grooves in the lower passivation layer over the scribe line region;
forming the two or more sub-alignment marks in the two or more grooves; and
forming an upper passivation layer on the lower passivation layer and on surfaces of the two or more sub-alignment marks, wherein the upper passivation layer and the lower passivation layer form the passivation layer.

12. The method according to claim 10, wherein:
the substrate further comprises a plurality of first regions adjacent to the scribe line region, wherein the scribe line region is located between adjacent first regions of the plurality of first regions.

13. The method according to claim 12, further comprising:
performing a dicing process on the scribe line region to form a plurality of mutually independent chips, wherein each chip comprises a first region of the plurality of first regions.

14. The method according to claim 10, wherein:

a sub-alignment mark of the two or more sub-alignment marks comprises a metal strip.

15. The method according to claim 10, wherein:

a length of the sub-alignment mark is in a range approximately between 70 μm and 120 μm;

a width of the sub-alignment mark is in a range approximately between 50 μm and 70 μm; and a minimum distance between the adjacent sub-alignment marks in the extension direction of the scribe line region is approximately 50 μm.

16. The method according to claim 10, wherein:

in a direction perpendicular to a surface of the substrate, a thickness of the sub-alignment mark is in a range approximately between 3.3 μm and 4 μm.

17. The method according to claim 10, further comprising:

forming test keys and metal pads in the passivation layer over the scribe line region.

* * * * *